United States Patent [19]

Clark

[11] Patent Number: 5,124,766
[45] Date of Patent: Jun. 23, 1992

[54] FILAMENT CHANNEL TRANSISTOR INTERCONNECTED WITH A CONDUCTOR

[75] Inventor: David R. Clark, Garland, Tex.

[73] Assignee: Texas Instruments Incorporated, Dallas, Tex.

[21] Appl. No.: 618,016

[22] Filed: Nov. 26, 1990

Related U.S. Application Data

[63] Continuation of Ser. No. 534,303, Jun. 5, 1990, abandoned, which is a continuation of Ser. No. 375,096, Jun. 30, 1989, abandoned.

[51] Int. Cl.$^5$ .................. H01L 29/68; H01L 29/78; H01L 29/92
[52] U.S. Cl. .................. 357/23.6; 357/23.4; 357/59; 357/68; 357/45
[58] Field of Search .......... 357/23.6, 23.4, 23.6 G, 357/59 E, 68, 45

[56] References Cited

U.S. PATENT DOCUMENTS

| | | | |
|---|---|---|---|
| 4,623,911 | 11/1986 | Pryor' | 357/42 |
| 4,672,410 | 6/1987 | Miura et al. | 357/23.6 |
| 4,673,962 | 6/1987 | Chatterjee | 357/23.6 |
| 4,686,552 | 8/1987 | Teng et al. | 357/23.6 G |
| 4,704,705 | 11/1987 | Womack | 357/23.6 |
| 4,713,678 | 12/1987 | Womack et al. | 357/23.6 |
| 4,791,463 | 12/1988 | Malhi | 357/23.4 |
| 4,816,884 | 3/1989 | Hwang | 357/23.6 |
| 4,845,539 | 7/1989 | Inoue | 357/23.4 |
| 4,918,499 | 4/1990 | Matsutani et al. | 357/23.6 |
| 4,953,125 | 8/1990 | Okumura et al. | 357/23.6 |
| 4,959,700 | 9/1990 | Yamazaki | 357/23.7 |
| 4,967,247 | 10/1990 | Kaga et al. | 357/23.6 |
| 4,974,060 | 11/1990 | Ogasawara | 357/23.4 |
| 4,984,038 | 1/1991 | Sunami et al. | 357/23.4 |

FOREIGN PATENT DOCUMENTS

| | | | |
|---|---|---|---|
| 61-144059 | 7/1986 | Japan | 357/23.6 |
| 62-208662 | 9/1987 | Japan | 357/23.6 |
| 62-268156 | 11/1987 | Japan | 357/23.6 |
| 62-273764 | 11/1987 | Japan | 357/23.6 |

OTHER PUBLICATIONS

IBM Technical Journal, vol. 30, No. 9 Feb. 1988, vol. 31, No. 7 Dec. 1988, vol. 29 No. 5 Oct. 1986, vol. 31, No. 3, Aug. 1988.

Primary Examiner—Andrew J. James
Assistant Examiner—Sara W. Crane
Attorney, Agent, or Firm—Richard B. Havill; Lawrence J. Bassuk; Richard L. Donaldson

[57] ABSTRACT

A method and apparatus is provided for allowing access to a buried wordline conductor (38) of a dynamic random access memory cell array. A selected memory cell is used as a wordline connection cell (47). A local oxide layer (43) is used during the etchant process which is used to form wordline conductors (38). The oxide layer (43) functions as a mask to create a wordline connection body (45). During the formation of the bitline conductors (42), a wordline contact (49) may be similarly formed to provide access to the wordline conductors (38). The wordline connection cell (47) provides efficient access to the wordline conductors (38) and uses only the substrate surface area occupied by a single memory cell.

39 Claims, 5 Drawing Sheets

FILAMENT CHANNEL TRANSISTOR INTERCONNECTED WITH A CONDUCTOR

This application is a continuation of application Ser. No. 07/534,303, filed Jun. 5, 1990, now abandoned, which is a continuation of application Ser. No. 07/375,096 filed Jun. 30, 1989, now abandoned.

TECHNICAL FIELD OF THE INVENTION

This invention relates in general to the field of integrated electronic devices and more particularly to contact to a transistor.

BACKGROUND OF THE INVENTION

One of the most important building blocks of modern integrated electronic systems is the random access memory array. Important limiting factors in the designs of the systems are the size, speed and power consumption of these memory arrays. Therefore, one of the chief concerns of electronic device designers is to reduce the size of the memory cells comprising these arrays.

A variety of methods have been used to increase the active device density of dynamic random access memory cell arrays. Conventional geometries of the memory cells have formed the pass gate transistors and the storage elements within the surface of the bulk semiconductor substrate. This provides for excellent device characteristics, but inherently uses more semiconductor surface area thereby increasing the memory cell size.

Attempts have been made to construct the constituent parts of the memory cells in a stacked geometry to reduce the cell size. This process requires that at least one or both of the active elements within the memory cell must be constructed outside of the bulk semiconductor substrate material. Using conventional geometries, this resulted in a degradation of the quality of the devices constructed. An additional problem resulting from the use of stacked configurations is that often complex processing steps are required to insure that contact can be made with the inner levels of the memory cell geometry. Contacts with the inner levels of these geometries made away from the memory cell array area occupy valuable substrate surface area.

Therefore, a need has arisen for a memory cell geometry which uses the advantages of the stacked configuration, but which allows for the efficient contacting of inner levels of the cell.

SUMMARY OF THE INVENTION

In accordance with the present invention, a method and apparatus are provided which substantially eliminate or reduce disadvantages and problems associated with prior techniques for providing access to buried structures in stacked memory cell geometries. More specifically, the present invention provides a memory cell geometry which uses a trench capacitor formed on a semiconductor substrate. The trench capacitor electrode is coupled to a filament channel transistor formed immediately above the trench capacitor. During the formation of the wordline conductor, process steps are taken to form wordline connection cells amongst the memory cells of the array. The wordline connection cells provide an access point to the buried wordline in the final memory cell array.

An important technical advantage of the present method results from the fact that it allows for access to the buried wordline of the present memory cell geometry, but does not require more surface area than that occupied by a single memory cell. In this manner, efficient access is provided to operate the memory cell array, but the use of the substrate surface area is kept to a minimum so that the surface area may be used for actual memory storage cells.

BRIEF DESCRIPTION OF THE DRAWINGS

A more complete understanding of the present invention may be acquired by referring to the detailed description and claims when considered in connection with the accompanying drawings in which like reference numbers indicate like features and wherein:

DETAILED DESCRIPTION OF THE INVENTION

Figure 1:
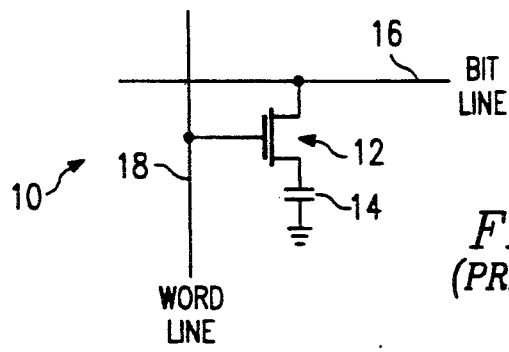
FIG. 1 is a schematic diagram illustrating the constituent parts of a conventional dynamic random access memory cell.

Referring to FIG. 1, a circuit, indicated generally at 10, is shown to comprise a pass gate transistor, indicated generally at 12, and a storage capacitor 14. The transistor 12 and the storage capacitor 14 are the conventional components of a dynamic random access memory cell. According to one method of accessing the memory cell formed by transistor 12 and storage capacitor 14, the source of the transistor 12 is coupled to a bitline 16 while the gate of the transistor 12 is coupled to a wordline 18. The drain of the transistor 12 is coupled to a first electrode of the storage capacitor 14. The remaining electrode of the storage capacitor 14 is coupled to a predetermined voltage level which may, for example, be the ground potential. In order to access the memory cell illustrated by circuit 10, the pass gate transistor 12 is turned on by applying a voltage to the wordline 18. The storage capacitor 14 may then be accessed in either a read or write operation. In a read operation, the bitline 16 would obtain a logical voltage level depending upon whether or not there was charge stored in storage capacitor 14. In a write operation, the pass gate transistor 12 would be activated and charge would be stored on the storage capacitor 14 from the bitline 16. In this manner, a single bit of digital information may be stored in and accessed from the memory cell shown in FIG. 1. In either a read or a write operation of a particular memory cell, the pass gate transistor 12 is activated by applying a voltage to its gate. Accordingly, access must be provided to the wordlines of any memory cell array.

Several of the chief concerns in designing a dynamic random access memory cell such as the one shown in circuit 10 are the storage capability of the storage capacitor 14 and the operational characteristics of the pass gate transistor 12. The pass gate transistor 12 must be able to transfer enough charge to charge storage capacitor 14, and alternatively, in its nonconductive mode, be able to prevent the discharge of storage capacitor 14. The storage capacitor 14 must be able to store enough charge for a sufficient period of time to enable a later reading of the information stored in the memory cell. All of these characteristics must be further constructed in a memory cell which occupies as small an area as possible.

Pass gate transistors which are constructed in the single crystalline semiconductor material of the bulk substrate have operational characteristics which are of the highest quality. However, these transistors require the use of the surface of the semiconductor substrate and therefore inherently decrease the device density of the memory cell array. Pass gate transistors which utilize polycrystalline or amorphous semiconductor material may be formed above the semiconductor substrates and thereby increase the possible device densities. Prior art polycrystalline or amorphous transistors have exhibited operational characteristics which make them difficult to use in the context of dynamic random access memory cells because of their high leakage currents. The memory cell constructed according to the teaching of the present invention utilizes a pass gate transistor which comprises a polycrystalline or amorphous channel region, but which because of its unique geometry demonstrates operational characteristics which are comparable to those pass gate transistors constructed using single crystalline semiconductor material. The pass gate transistor used for the memory cell of the present invention is fully described in Applicant's copending patent application entitled "Filament Channel Transistor" Ser. No. 374,335, filed concurrently herewith.

The memory cell of the present invention also comprises a trench capacitor formed in the semiconductor substrate. A trench capacitor allows for a large amount of charge to be stored within the memory cell of the present invention while using a minimum of semiconductor substrate surface area. Because of the unique vertical orientation of the pass gate transistor and the trench capacitor, the memory cell of the present invention has a cell size and potential device density heretofore impossible in conventional dynamic random access memory cells.

As will be discussed in more detail herein, the stacked configuration of the memory cell presents the problem of how to efficiently contact the wordlines within the cell array using as little substrate surface area as possible. Referring to FIGS. 2a through 2h, one possible method of constructing several memory cells of the present invention is shown which includes a description of the method of the present invention for contacting the wordline. FIGS. 2a through 2h illustrate the construction of individual memory cells and a wordline connection cell. These cells are shown to illustrate important technical advantages involving the spacing between the cells and the relative geometry of the active memory cell and the wordline connection cells. However, it should be understood that a memory cell array constructed according to the teaching of the present invention may comprise any number of memory cells and wordline connection cells depending upon the circumstances and needs of the particular circuit application.

Figure 2A:
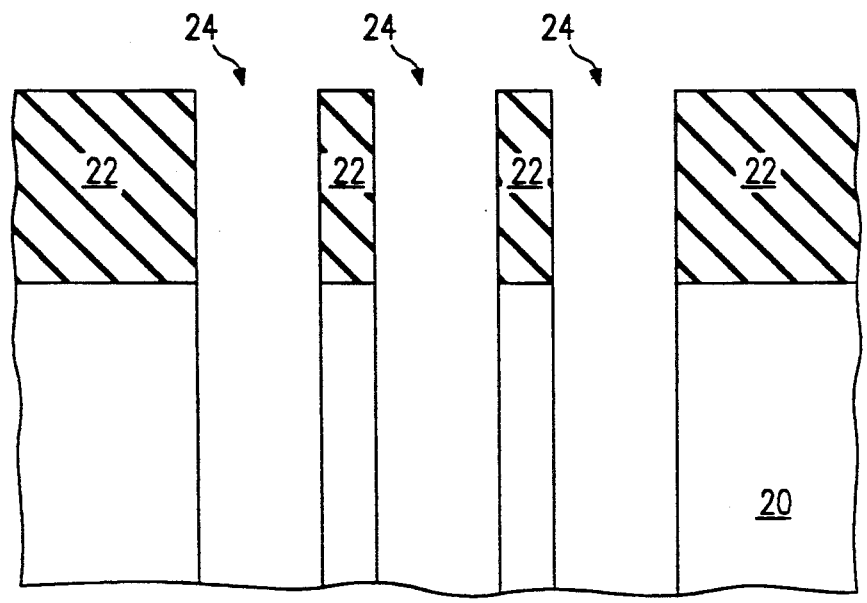
FIGS. 2a through 2i are greatly enlarged schematic diagrams illustrating the method of the present invention for contacting the wordline of a memory cell.

Referring to FIG. 2a, a semiconductor substrate 20 is shown. A thick layer of oxide 22 is either deposited or grown on an outer surface of substrate 20. Oxide layer 22 may be, for example, approximately one micron in thickness. As will be discussed later, the thickness of oxide layer 22 determines in part the length of the channel region of the pass gate transistor. The outer surface of oxide layer 22 is patterned with photoresist; and trenches, indicated generally at 24, are etched through oxide layer 22 and into substrate 20. The depth of the trenches 24 determines in part the amount of charge that will be stored in the storage capacitors of the memory cells. Therefore, the trenches 24 can be anywhere from approximately three to ten microns in depth depending upon the particular application.

Figure 2B:
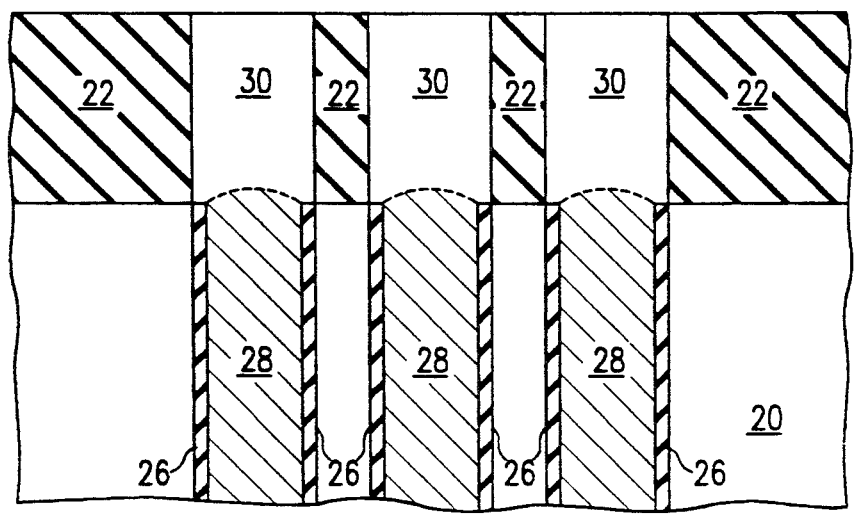

Referring now to FIG. 2b, a storage layer 26 is either grown or deposited on the inner portions of the walls of the trenches 24. Storage layers 26 comprise a dielectric which may, for example, comprise a thin layer of oxide. This layer of oxide may be grown on the walls of the trenches 24 to be approximately 150 angstroms in thickness. In the alternative, other dielectrics may be used to form storage layers 26. For example, a thin layer of oxide may first be grown to be a thickness on the order of 70 angstroms. A thin layer of nitride can then be deposited to a thickness of approximately 90 angstroms. An extremely thin layer of oxide on the order of 30 angstroms of thickness can then be either grown or deposited to form an oxide nitride oxide sandwich. This multi-layer dielectric is more complicated to construct, but has an extremely high dielectric constant and therefore creates an extremely effective trench capacitor to be used as the storage element for each of the memory cells.

The trench capacitors are completed by forming storage electrodes 28 within the remaining space in each of the storage trenches 24. The storage electrodes 28 may comprise, for example, polycrystalline silicon which may be deposited in the trenches 24.

Storage electrodes 28 must be doped to be conductive to provide contact between the drains of the pass gate transistors to be formed and the storage layers 26. However, the upper portion of the polycrystalline plug filling the trenches 24 must remain undoped so that it may be used to form the channel of the filament channel pass gate transistor, as will be discussed later. The undoped portions of the polycrystalline material are indicated at 30 in FIG. 2b. One method for obtaining a uniform dopant concentration in the storage electrodes 28 while maintaining a relatively dopant-free area 30, requires filling the trenches 24 in a series of steps. First, a layer of polycrystalline silicon is deposited so that it covers the storage layer 26 but leaves a groove almost to a bottom of the trenches 24. Dopant is then introduced into the groove and then the groove is filled with an additional layer of polycrystalline silicon. By filling the trenches 24 using two layers of polycrystalline silicon, the innermost regions of the storage electrodes 28 are insured a uniform concentration of the dopant and are, thus, rendered conductive. The polycrystalline silicon may be doped, for example, with phosphorous oxychloride to render it conductive In the next step, the conductive polycrystalline layer is etched back to the outer surface of the substrate 20 using an etchant which is selective to oxide. A layer of relatively dopant-free polycrystalline silicon is then deposited in the remaining outer portions of trenches 24 to form the relatively dopant-free polysilicon areas 30 shown in FIG. 2b.

Figure 2C:
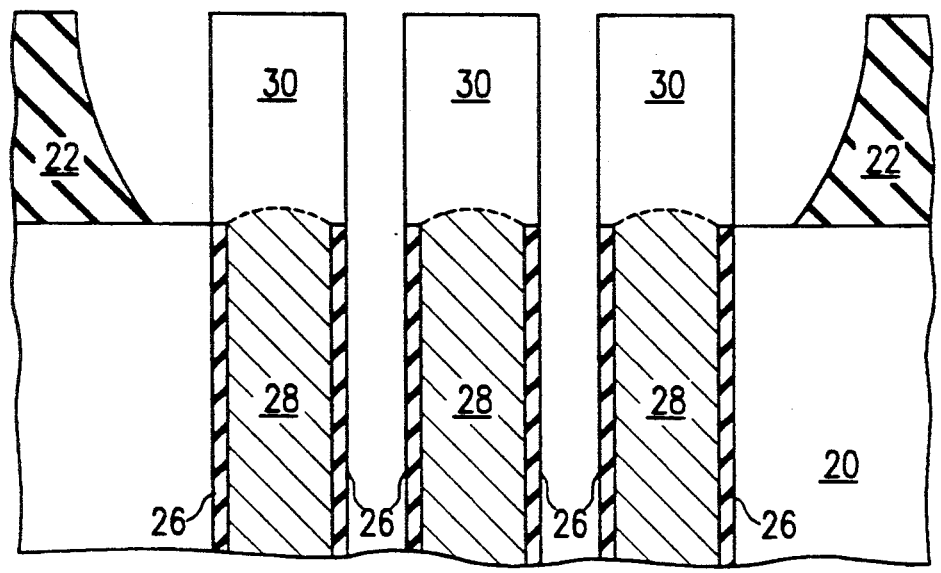

Referring to FIG. 2c, the oxide layer 22 is removed to leave the dopant-free polycrystalline pillars 30 exposed. The portions of the oxide layer 22 removed may be removed using a wet etch of hydrofluoric acid. Although a demarcation is used in the figures to show the difference in the dopant concentration between storage electrodes 28 and the undoped polycrystalline pillars 30, it should be understood that no such exact boundary would actually exist. Through the processing steps dopants would undoubtedly migrate from the storage electrodes 28 into the undoped pillars 30 to form a dopant concentration gradient. The demarcation shown in the figures is used for the purposes of illustrating that the storage electrode 28 must be doped such that it is rendered conductive while the pillars 30 must remain subject to the traditional semiconductor effects.

Figure 2D:
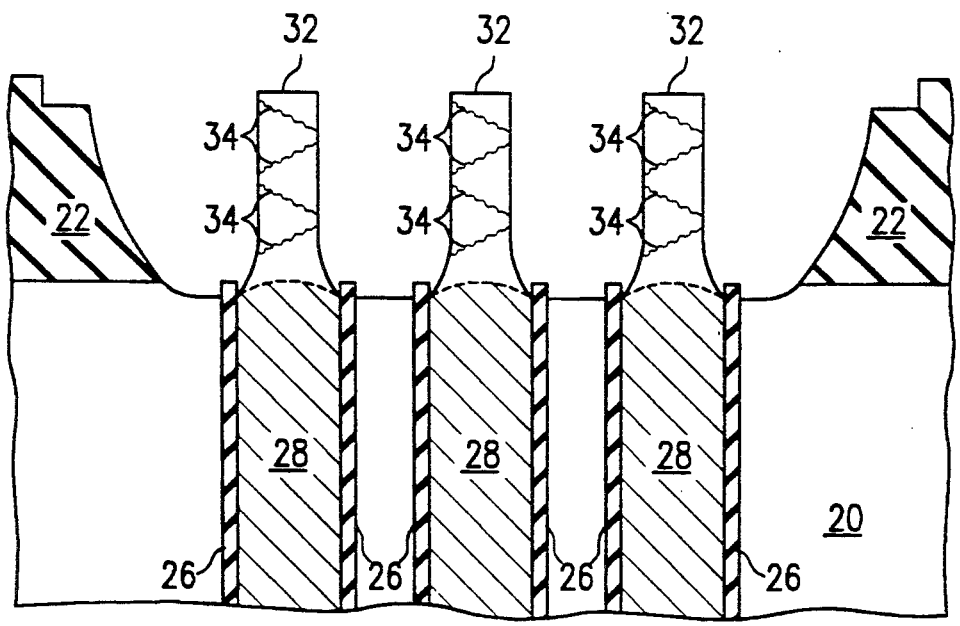

Referring to FIG. 2d, the undoped polycrystalline pillars 30 are subjected to an oxidation process which consumes portions of the pillars 30 to form the filament channels 32. This process results in several important technical advantages. The oxidation process reduces the diameter of the pillars 30 to a dimension which is smaller than that which is capable of being created using conventional photolithographic techniques. The small diameter of the filament channels 32 creates more room between the filament channels 32 for the subsequent deposition of gate material. In addition, the small diameter of the filament channels 32 reduces the parasitic capacitance between the pass gate channel and the gate conductor which will serve as the wordline for the memory cell. Additionally, during the oxidation process, the polycrystalline material which comprises the pillars 30 recrystallizes to form grain boundary profiles indicated by grain boundaries 34 shown in FIG. 2d. Grain boundaries are the boundaries within a polycrystalline material which separate the single crystalline regions of the material.

One of the primary reasons that polycrystalline and amorphous semiconductor materials have, in the past, made poor transistor channels is that charge carriers were able to flow along grain boundaries through the material. Charge carriers flowing along grain boundaries are not subject to traditional semiconductor effects and therefore provide a large component of the leakage currents often present in transistors using polycrystalline or amorphous material for the channel region. In order for charge to flow along grain boundaries in these transistors, the grain boundaries must provide a continuous path running through the channel region. If the grain boundary profile of a channel region is similar to that schematically illustrated by grain boundaries 34 in FIG. 2d, there is no such continuous path through the channel region. The recrystallization of the filament channels 32 cuts off the majority of grain boundaries such that the grain boundaries remaining are primarily perpendicular to the current passing through the filament channels 32. Thus, the preponderance of charge carriers must pass through the single crystalline semiconductor material contained within the individual grains comprising each of the channel filament channels 32. When the charge carriers are within the grains comprising the filament channels 32, they are subject to the traditional semiconductor effects. In this manner, while the filament channels 32 are constructed of polycrystalline semiconductor material, they exhibit operational characteristics which are comparable to transistors formed using single crystalline semiconductor material. The filament channels 32 therefore have very low leakage currents and are, thus, capable of maintaining the charge stored within the storage layers 26 of the trench capacitors.

The recrystallization of the material in the filament channels 32 may be aided if the oxidation process is conducted at a temperature below 970° C. This is the temperature at which the oxide forming around the filament channels 32 would readjust itself as a slow moving fluid If the temperature is below 970° C., the oxide forming around filament channels 32 will not readjust itself and tremendous pressures will be exerted on the filament channels 32 aiding in the recrystallization process.

The recrystallization process also serves to partially deplete the filament channels 32 of p-type dopants which may have migrated upward from the storage electrodes 28. Hence, it is preferable to use a p-type dopant, such as boron, to dope the storage electrodes 28.

As shown in FIG. 2d, the oxide layer formed in the oxidation process is removed using an etchant which is selective to silicon. After the oxide layer is removed, the filament channels 32 are left exposed and it is possible to then dope the filament channels 32 to adjust the operational characteristics of the pass gate transistors without affecting the characteristics of the trench capacitors.

Figure 2E:
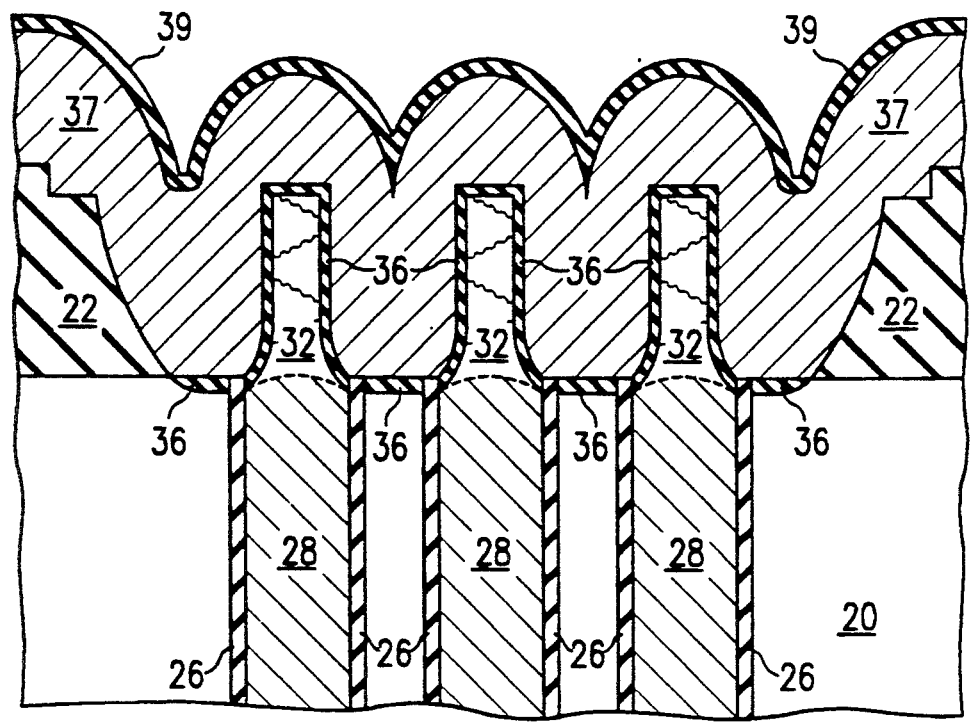

Referring to FIG. 2e, a thin gate oxide layer 36 is grown over the exposed outer surfaces of substrate 20 and the outer surfaces of the filament channels 32. Gate oxide layer 36 may, for example, be on the order of 200 to 250 angstroms in thickness. A layer 37 of polycrystalline or amorphous silicon is then deposited and doped using, for example, phosphorous oxychloride to render it conducive. A layer of nitride 39 is then deposited conformally over layer 37 of polycrystalline or amorphous silicon.

Figure 2F:
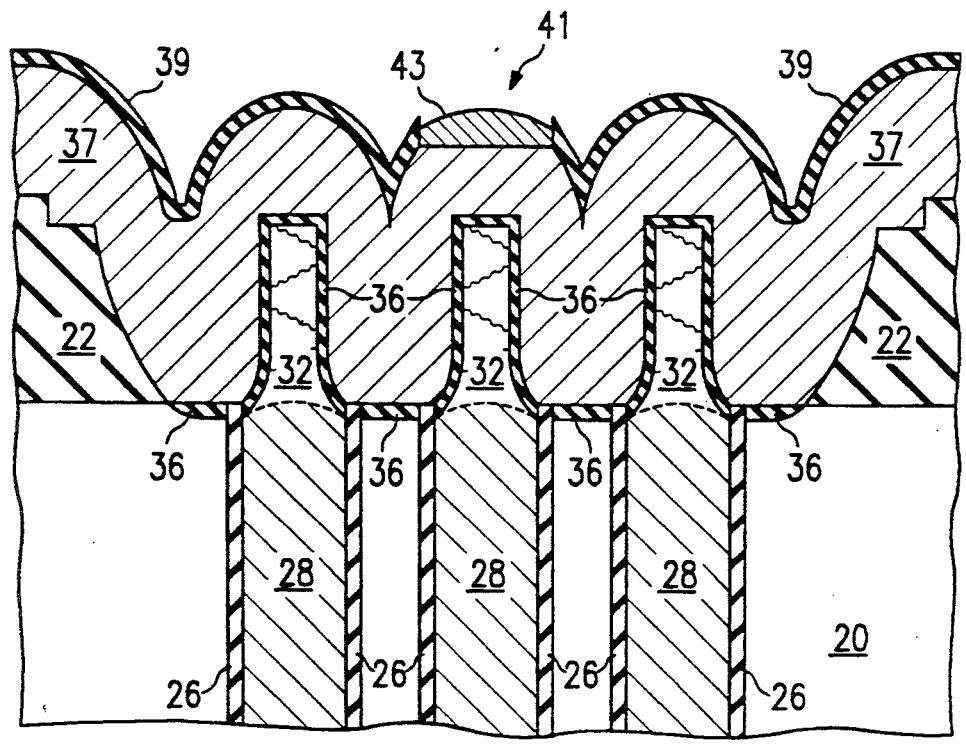

Referring to FIG. 2f, an opening indicated generally at 41 is made in nitride layer 39 by patterning and etching the outer surface of nitride layer 39 and etching using an etchant solution which is selective to silicon. A local oxidation step is then made to form an oxide layer 43 on the exposed outer surface of layer 37 within opening 41. Nitride layer 39 is then removed using a nitride etchant such as phosphoric acid.

Figure 2G:
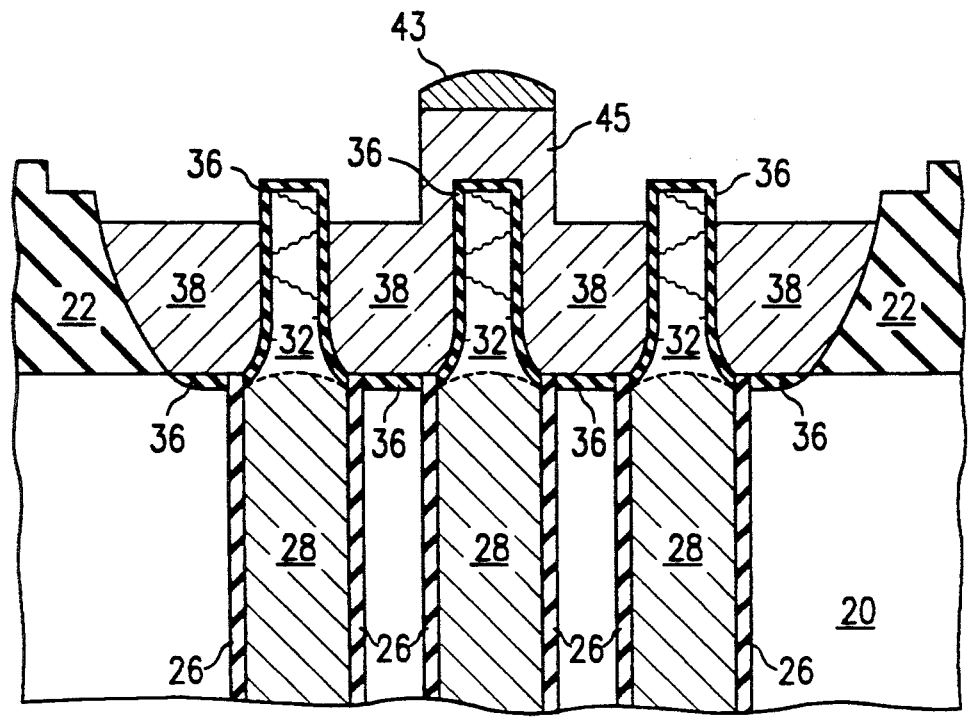

Referring to FIG. 2g, layer 37 is then anisotropically etched using an etchant which is extremely selective to oxide to form wordline conductor 38. Wordline conductor 38 surrounds the filament channels 32 but is insulated from the filament channels 32 by the gate oxide layer 36. Wordline conductor 38 is long strands of conductive material which run parallel to the plane of the cross section of FIG. 2g. The spacing between the memory cells in the plane perpendicular to the plane shown in FIGS. 2a through 2h must be sufficient such that the anisotropic etching process, used to form wordline conductor 38, separates the conductors of each adjacent cell. However, in the plane of the cross section shown in FIGS. 2a through 2f, the wordline conductor must be continuous to connect the adjacent cells in this plane.

Wordline conductor 38, as discussed previously, surrounds filament channels 32 and also extends outwardly and covers the central filament channel 32 to form a wordline connection body indicated at 45. In this manner, the center memory cell shown in FIG. 2g is used as a wordline connection cell 47. Wordline connection cell 47 will not be a functional memory cell, but is used to provide an access point to wordline conductor 38.

Figure 2H:
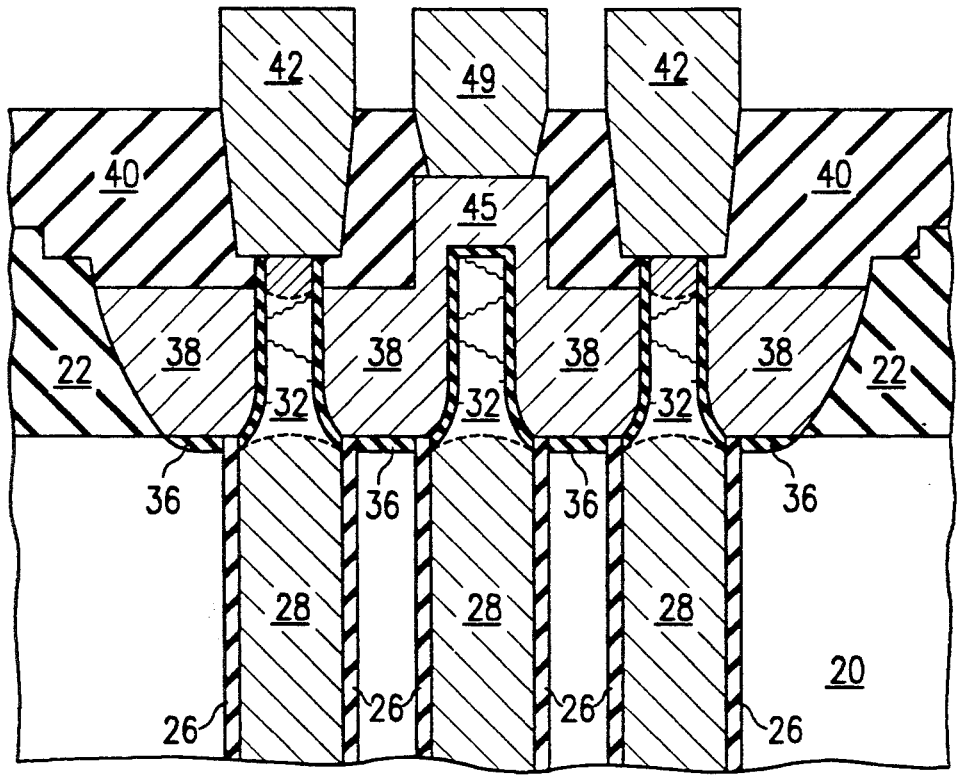

Referring to FIG. 2h, the final structure of two active memory cells and a single wordline connection cell is illustrated. In the final processing steps, a thick layer of oxide is deposited to form isolation layer 40. The outer surface of isolation layer 40 is then patterned and etched to provide openings to provide contact to the filament channels 32 and wordline connection body 45. An etchant which is selective to silicon may be used such that the etching process will continue until the tops of the two outer filament channels 32 and the outer surface of wordline connection body 45 are left exposed. The etchant process must leave a portion of isolation layer 40 disposed between the openings formed in isolation layer 40 and the wordline conductors 38.

The upper portions of the two outer filament channels 32 must be rendered conductive to allow for electrical contact between the bitlines to be formed later and the portions of the filament channels 32 activated by the wordline conductor 38. This may be, accomplished by doping the outer portions of filament channels 32 after they are exposed by the etching step used to form the aforementioned openings. After the outer portions of the filament channels 32 are doped to be conductive, a layer of conductive material is deposited, patterned and etched to form bitlines 42 and wordline contact 49 shown in FIG. 2f. Bitlines 42 and wordline contact 49 may comprise, for example, aluminum or tungsten or, alternatively, may comprise either a layer of polycrystalline silicon or a silicided layer of polycrystalline silicon.

Figure 2I:
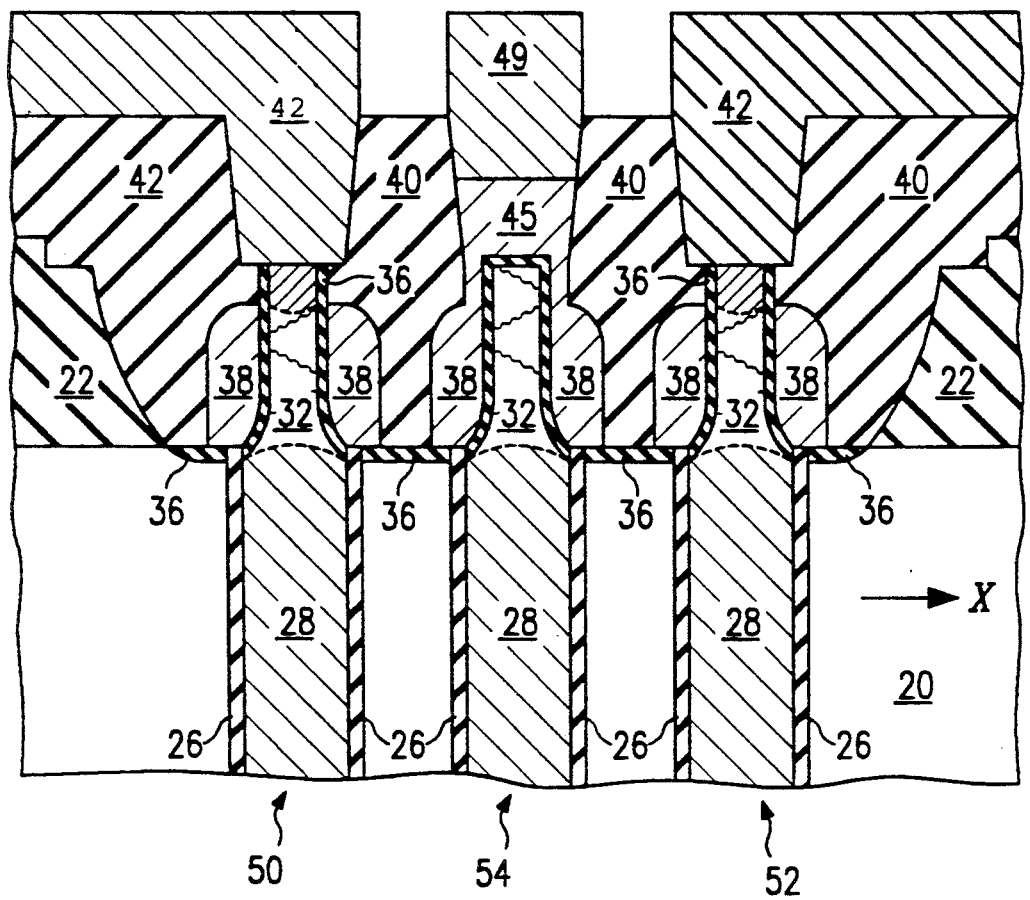

FIG. 2i illustrates two active memory cells 50 and 52 and a wordline connection cell 54 constructed according to the teachings of the present invention but is shown in a plane perpendicular to that illustrated in FIGS. 2a through 2h. FIG. 2i illustrates the difference in the spacing between adjacent cells in the two different planes shown. In the plane shown in FIG. 2i, the adjacent cells are spaced farther apart than in the plane shown in FIGS. 2a through 2h. The wordline conductor 38 is shown in FIGS. 2a through 2h to be a continuous conductive filament coupling the adjacent memory cells in the row.

In FIG. 2i, however, the separation between wordline conductors 38 of adjacent cells is shown. As can be seen in FIG. 2i, by electrically bringing the wordline conductor 38 to the outer surface of the final structure through wordline connection body 45 and wordline contact 49, access to wordline conductor 38 may be provided by contacting wordline contact 49 on the same level of metal as bitlines 42 or by using an additional layer of metal (not shown) disposed outwardly from and insulated from bitlines 42.

The spacing between adjacent memory cells in the X-plane which is shown in FIG. 2i is on the order of one micron between adjacent storage electrodes 28. However, the spacing between adjacent memory cells in the Y-plane which is shown in FIGS. 2a through 2h is on the order of 0.6 microns between adjacent storage electrodes 28. These dimensions result in a cell size of approximately 1.4 microns by 1.8 microns, or slightly greater than 2.5 square microns per cell assuming a 0.8 micron diameter trench and the trench-to-trench spacings discussed previously. An important technical advantage of the present invention is that access to the buried wordline of the memory cell is conveniently and efficiently available and only requires the use of the substrate surface area occupied by a single memory cell.

The filament channel transistor used as the pass gate transistor in each of the memory cells of the present invention contains several technical advantages. The substantially cylindrical shape of the filament channels 32 enable the pass gate transistors to be very sensitive to small changes in gate voltages placed on the wordline conductors 38. Because the wordline conductors 38 completely surround the cylindrical filament channels 32, it is possible to completely deplete or completely invert the semiconductor material contained in the filament channels 32 depending upon the mode of operation desired. Further, the general vertical orientation of the filament channel 32 enables the extremely small cell sizes of the present invention. Further, the novel method of accessing the buried wordlines of the memory cell further allows for efficient access to the gates of the pass gate transistors while occupying a minimum of the substrate surface area.

In summary, a memory cell is provided which comprises a trench capacitor formed in a semiconductor substrate. A storage electrode of the trench capacitor is coupled to a filament channel which is insulatively surrounded by a wordline gate conductor. The end of the filament channel distal to the semiconductor surface is coupled to a bitline conductor A selected number of cells are used to construct wordline connection cells to allow for efficient access to the gates of the pass gate transistors. The wordline material is masked during the etching step used to create the wordlines to allow for contact to be made to the buried wordlines In operation, the filament channel is rendered conductive by placing a voltage on the wordline conductor and the trench capacitor is either charged or discharged through the bitline conductor. Although the present invention has been described in detail, it should be understood that various changes, substitutions and alterations can be made hereto without departing from the spirit and scope of the invention as defined by the appended claims.

What is claimed is:

1. A plurality of memory cells comprising:
   a substrate;
   a plurality of trenches formed in said substrate;
   a dielectric layer formed on the surfaces of each trench;
   a conductor formed in each trench;
   a semiconductor post extending from the top of each conductor, as a transistor channel;
   a transistor gate insulator formed on each semiconductor post;
   a transistor gate conductor surrounding each of said semiconductor posts, said transistor gate conductor extending onto the top of one of said semiconductor posts, said transistor gate conductor being connected to a wordline above said one semiconductor post; and
   a plurality of bitline connectors in electrical connection with the top of said semiconductor posts except said one semiconductor post, said bitline connectors being conductively connected to a plurality of bitlines.

2. A plurality of memory cells as in claim 1 wherein said dielectric layer comprises a first silicon dioxide layer, a silicon nitride layer formed on said first silicon dioxide layer and a second silicon dioxide layer formed on said silicon nitride layer.

3. A plurality of memory cells as in claim 1 wherein said conductor in each of said trenches comprises polycrystalline silicon.

4. A plurality of memory cells, as in claim 1, wherein said semiconductor posts comprise 5. A plurality of memory cells, as in claim 1, wherein each of said semiconductor posts forms a filament channel of recrystallized polysilicon having grain boundaries oriented transverse to a current path through the filament channel.

6. A plurality of memory cells, as in claim 1, wherein the transistor gate insulator, formed on each semiconductor post, is formed by an oxidation process on the semiconductor post.

7. A plurality of memory cells, as in claim 1, wherein at least a portion of the transistor channel is dopant-free, directionally recrystallized polysilicon.

8. A plurality of memory cells, as in claim 1, wherein at least a portion of the transistor channel is directionally recrystallized polysilicon having a dopant concentration gradient.

9. A plurality of memory cells, as in claim 1, wherein at least a portion of the transistor channel is directionally recrystallized polysilicon including a dopant.

10. A device comprising:
   a substrate;
   a conductor above the substrate;
   a semiconductor post extending from the top of the conductor, as a transistor channel, the semiconductor post comprising directionally recrystallized polycrystalline silicon;
   a transistor gate insulator formed on the semiconductor post;
   a transistor gate conductor surrounding the semiconductor post, the transistor gate conductor extending onto the top of the semiconductor post connecting to a conductor above the semiconductor post.

11. A device, in accordance with claim 10, wherein the semiconductor post forms a filament channel of recrystallized polycrystalline silicon having grain boundaries oriented transverse to a current path through the filament channel.

12. A device, in accordance with claim 10, wherein the transistor gate insulator is formed on the semiconductor post by an oxidation process.

13. A device, in accordance with claim 10, wherein at least a portion of the transistor channel is dopant-free, directionally crystallized polycrystalline silicon.

14. A device, in accordance with claim 10, wherein at least a portion of the transistor channel is directionally crystallized polycrystalline silicon having a dopant concentration gradient.

15. A device, in accordance with claim 10, wherein at least a portion of the transistor channel is directionally crystallized polycrystalline silicon including a dopant.

16. A memory array comprising:
   a plurality of filament channel transistors formed in conjunction with a semiconductor substrate;
   a wordline conductor coupled to one or more of said filament channel transistors, said wordline having an integral wordline connection body extending outwardly from the substrate and disposed outwardly from a channel body of one of said filament channel transistors of a selected memory cell selected to be inactive such that said selected memory cell may be used as a wordline connection cell; and
   wordline contact coupled to the wordline connection body.

17. The array of claim 16, wherein said wordline connection body comprises semiconductor material and dopants rendering said material conductive.

18. The array of claim 17 wherein said semiconductor material comprises silicon.

19. The array of claim 16 wherein said wordline connection body comprises amorphous semiconductor material and dopants rendering said material conductive.

20. The array of claim 19 wherein said semiconductor material comprises silicon.

21. The array of claim 16 wherein said wordline contact comprises metal.

22. The array of claim 16 wherein said wordline contact comprises aluminum.

23. The array of claim 16 wherein said wordline contact comprises tungsten.

24. The array of claim 16 wherein said wordline contact comprises a layer of polycrystalline silicon.

25. The array of claim 24 wherein said wordline contact further comprises a layer of silicide disposed on said layer of polycrystalline silicon.

26. The array of claim 16 wherein each of said plurality of filament channel transistors comprises:
   a substantially cylindrical channel body comprising a semiconductor material; and
   a gate conductor coupled to said wordline conductor and insulatively disposed above said channel body.

27. An array of memory cells formed in a surface of a semiconductor substrate, comprising:
   a plurality of trench capacitors formed in the substrate;
   a plurality of filament channel transistors, each filament channel transistor formed in contact with a respective one of said trench capacitors;
   a wordline conductor coupled to one or more of said filament channel transistors, said wordline having an integral wordline connection body extending outwardly from the substrate; said wordline connection body being disposed adjacent an end of a selected one of said filament channel transistors in said row, said end of said one filament channel transistor distal the substrate surface, said one filament channel transistor resident in a memory cell selected to be inactive to serve as a wordline connection cell; and
   a wordline contact coupled to said wordline connection body.

28. The array of claim 27 wherein said wordline conductor comprises polycrystalline semiconductor material and dopants rendering said material conductive.

29. The array of claim 28 wherein said material comprises silicon.

30. The array of claim 27 wherein said wordline connection body comprises polycrystalline semiconductor material and dopants rendering said material conductive.

31. The array of claim 30 wherein said material comprises silicon.

32. The array of claim 27 wherein said wordline connection body comprises amorphous semiconductor material and dopants rendering said material conductive.

33. The array of claim 32 wherein said semiconductor material comprises silicon.

34. The array of claim 27 wherein said wordline contact comprises metal.

35. The array of claim 27 wherein said wordline contact comprises aluminum.

36. The array of claim 27 wherein said wordline contact comprises tungsten.

37. The array of claim 27 wherein said wordline contact comprises a layer of polycrystalline silicon.

38. The array of claim 37 wherein said wordline contact further comprises a layer of silicide disposed on said layer of polycrystalline silicon.

39. The array of claim 27 wherein each of said plurality of transistors comprises:
   a substantially cylindrical channel body having two ends and comprising a semiconductor material a first of said two ends coupled to said respective one of said trench capacitors; and
   a gate conductor substantially surrounding and insulated from said channel body, said gate conductor coupled to said wordline conductor.

* * * * *